United States Patent
Ma et al.

(10) Patent No.: US 10,665,821 B2
(45) Date of Patent: May 26, 2020

(54) ORGANIC LIGHT-EMITTING DIODE WITH INTERMEDIATE LAYER MADE OF YTTERBIUM ELEMENT, DISPLAY PANEL AND DISPLAY DEVICE

(71) Applicant: SHANGHAI TIANMA AM-OLED CO., LTD., Shanghai (CN)

(72) Inventors: Honghu Ma, Shanghai (CN); Jinghua Niu, Shanghai (CN); Xiangcheng Wang, Shanghai (CN); Run Yang, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 56 days.

(21) Appl. No.: 15/888,092

(22) Filed: Feb. 5, 2018

(65) Prior Publication Data
US 2018/0159084 A1  Jun. 7, 2018

(30) Foreign Application Priority Data
Aug. 10, 2017  (CN) .......................... 2017 1 0682462

(51) Int. Cl.
*H01L 51/52* (2006.01)
*H01L 51/50* (2006.01)
*H01L 51/00* (2006.01)
*H01L 27/28* (2006.01)

(52) U.S. Cl.
CPC ........ *H01L 51/5278* (2013.01); *H01L 51/002* (2013.01); *H01L 51/5004* (2013.01); *H01L 27/286* (2013.01)

(58) Field of Classification Search
CPC .................. H01L 51/5278; H01L 51/002; H01L 51/5004
See application file for complete search history.

(56) References Cited

U.S. PATENT DOCUMENTS

| | | | |
|---|---|---|---|
| 2014/0117337 A1* | 5/2014 | Jung | H01L 51/5044 257/40 |
| 2019/0006433 A1* | 1/2019 | Peng | H01L 51/5044 |

FOREIGN PATENT DOCUMENTS

| CN | 104409648 A | 3/2015 |
|---|---|---|
| CN | 106129099 A | 11/2016 |

* cited by examiner

*Primary Examiner* — Lex H Malsawma
*Assistant Examiner* — Xia L Cross
(74) *Attorney, Agent, or Firm* — Kilpatrick Townsend & Stockton, LLP

(57) ABSTRACT

The disclosure discloses an organic light-emitting diode, a display panel and a display device. The organic light-emitting diode includes an anode, a cathode, at least two emitting layers arranged between the anode and the cathode, and a charge generation layer arranged between every two adjacent emitting layers, where the charge generation layer includes a first doping layer, an intermediate layer and a second doping layer which are arranged in sequence along the direction far away from the cathode, where the first doping layer includes a P-type semiconductor material, and the second doping layer includes a N-type semiconductor material; the P-type semiconductor material includes a P-type inorganic semiconductor material, a P-type metal dopant or a P-type organic semiconductor material, and the N-type semiconductor material includes a N-type inorganic semiconductor material, a N-type metal dopant or a N-type organic semiconductor material.

11 Claims, 7 Drawing Sheets

US 10,665,821 B2

ORGANIC LIGHT-EMITTING DIODE WITH INTERMEDIATE LAYER MADE OF YTTERBIUM ELEMENT, DISPLAY PANEL AND DISPLAY DEVICE

CROSS-REFERENCE TO RELATED APPLICATIONS

This application claims priority to Chinese Patent Application No. 201710682462.X, filed on Aug. 10, 2017, the entire content of which is incorporated herein by reference.

FIELD

This application relates to the technical field of display, and in particular to an organic light-emitting diode, a display panel and a display device.

BACKGROUND

The organic electroluminescence is a phenomenon in which organic material are excited by an electric energy for light emitting. With advantages of low drive voltage, high luminous brightness, high luminous efficiency, wide luminous viewing angle, high response speed, ultrathin shape, light weight and compatible flexible substrate, the organic light-emitting devices occupy a position in the field of display.

As a representative product of organic light-emitting devices, the Organic Light-Emitting Diode (OLED) has been extensively studied.

Please refer to FIG. 1, a common organic light-emitting diode in the prior art includes a cathode 0100, an electron injection layer 01, a first electron transport layer 02, a first emitting layer 031, a second hole transport layer 04, a charge generation layer 05, a second electron transport layer 06, a second emitting layer 032, a first hole transport layer 07, a hole injection layer 08 and an anode 0200 which are arranged in sequence in an overlaying manner. The charge generation layer 05 arranged between two emitting layers 03 usually includes a P-type organic semiconductor layer 051 and an N-type organic semiconductor layer 052 which are arranged in an overlapping manner. The P-type organic semiconductor layer 051 and the N-type organic semiconductor layer 052 of the charge generation layer 05 contact with each other directly, and along with the extension of accumulating operating time of the organic light-emitting diode, the material of the P-type organic semiconductor layer 051 and the N-type organic semiconductor layer 052 are subjected to mutual diffusion, therefore, the drive voltage of the organic light-emitting diode adopting such a structure gradually rises, and the luminous efficiency of the organic light-emitting diode is reduced, and the service life is shortened.

SUMMARY

Embodiment of the present disclosure is to provide an organic light-emitting diode, a display panel and a display device, so as to improve the voltage stability of the organic light-emitting diode during long-term operation, reduce the use power consumption of the organic light-emitting diode, and prolong the service life and improve the luminous efficiency of the organic light-emitting diode.

The organic light-emitting diode according to an embodiment of the present disclosure includes an anode, a cathode, at least two emitting layers arranged between the anode and the cathode, and a charge generation layer arranged between every two adjacent emitting layers, where the charge generation layer includes a first doping layer, an intermediate layer and a second doping layer which are arranged in sequence along the direction far away from the cathode, where the first doping layer includes a P-type semiconductor material, and the second doping layer includes a N-type semiconductor material; the P-type semiconductor material includes a P-type inorganic semiconductor material, a P-type metal dopant or a P-type organic semiconductor material, and the N-type semiconductor material includes a N-type inorganic semiconductor material, a N-type metal dopant or a N-type organic semiconductor material; when the P-type semiconductor material includes the P-type inorganic semiconductor material or the P-type metal dopant, a fermi level of the material of the intermediate layer is greater than the fermi level of the P-type semiconductor material; when the P-type semiconductor material includes the P-type organic semiconductor material, the fermi level of the material of the intermediate material is greater than the energy level of the highest occupied molecular orbital of the P-type organic semiconductor material; when the N-type semiconductor material includes the N-type inorganic semiconductor material or the N-type metal dopant, the fermi level of the material of the intermediate layer is less than the fermi level of the N-type semiconductor material; and when the N-type semiconductor material includes the N-type organic semiconductor material, the fermi level of the material of the intermediate material is less than the energy level of the lowest unoccupied molecular orbital of the N-type organic semiconductor material.

The embodiment of the present disclosure further provides a display panel, and the display panel includes an organic light-emitting diode. The organic light-emitting diode includes an anode, a cathode, at least two emitting layers arranged between the anode and the cathode, and a charge generation layer arranged between every two adjacent emitting layers, where the charge generation layer includes a first doping layer, an intermediate layer and a second doping layer which are arranged in sequence along the direction far away from the cathode, where the first doping layer includes a P-type semiconductor material, and the second doping layer includes a N-type semiconductor material; the P-type semiconductor material includes a P-type inorganic semiconductor material, a P-type metal dopant or a P-type organic semiconductor material, and the N-type semiconductor material includes a N-type inorganic semiconductor material, a N-type metal dopant or a N-type organic semiconductor material; when the P-type semiconductor material includes the P-type inorganic semiconductor material or the P-type metal dopant, a fermi level of the material of the intermediate layer is greater than the fermi level of the P-type semiconductor material; when the P-type semiconductor material includes the P-type organic semiconductor material, the fermi level of the material of the intermediate material is greater than the energy level of the highest occupied molecular orbital of the P-type organic semiconductor material; when the N-type semiconductor material includes the N-type inorganic semiconductor material or the N-type metal dopant, the fermi level of the material of the intermediate layer is less than the fermi level of the N-type semiconductor material; and when the N-type semiconductor material includes the N-type organic semiconductor material, the fermi level of the material of the intermediate material is less than the energy level of the lowest unoccupied molecular orbital of the N-type organic semiconductor material.

The embodiment of the present disclosure further provides a display device, and the display device includes a display panel. The display panel includes an organic light-emitting diode. The organic light-emitting diode includes an anode, a cathode, at least two emitting layers arranged between the anode and the cathode, and a charge generation layer arranged between every two adjacent emitting layers, where the charge generation layer includes a first doping layer, an intermediate layer and a second doping layer which are arranged in sequence along the direction far away from the cathode, where the first doping layer includes a P-type semiconductor material, and the second doping layer includes a N-type semiconductor material; the P-type semiconductor material includes a P-type inorganic semiconductor material, a P-type metal dopant or a P-type organic semiconductor material, and the N-type semiconductor material includes a N-type inorganic semiconductor material, a N-type metal dopant or a N-type organic semiconductor material; when the P-type semiconductor material includes the P-type inorganic semiconductor material or the P-type metal dopant, a fermi level of the material of the intermediate layer is greater than the fermi level of the P-type semiconductor material; when the P-type semiconductor material includes the P-type organic semiconductor material, the fermi level of the material of the intermediate material is greater than the energy level of the highest occupied molecular orbital of the P-type organic semiconductor material; when the N-type semiconductor material includes the N-type inorganic semiconductor material or the N-type metal dopant, the fermi level of the material of the intermediate layer is less than the fermi level of the N-type semiconductor material; and when the N-type semiconductor material includes the N-type organic semiconductor material, the fermi level of the material of the intermediate material is less than the energy level of the lowest unoccupied molecular orbital of the N-type organic semiconductor material.

DETAILED DESCRIPTION OF THE EMBODIMENTS

In order to improve the voltage stability of the organic light-emitting diode during long-term operation, lower the use power consumption of the organic light-emitting diode, prolong the service life and improve the luminous efficiency of the organic light-emitting diode, embodiments of the present disclosure provide an organic light-emitting diode, a display panel and a display device.

Figure 1:
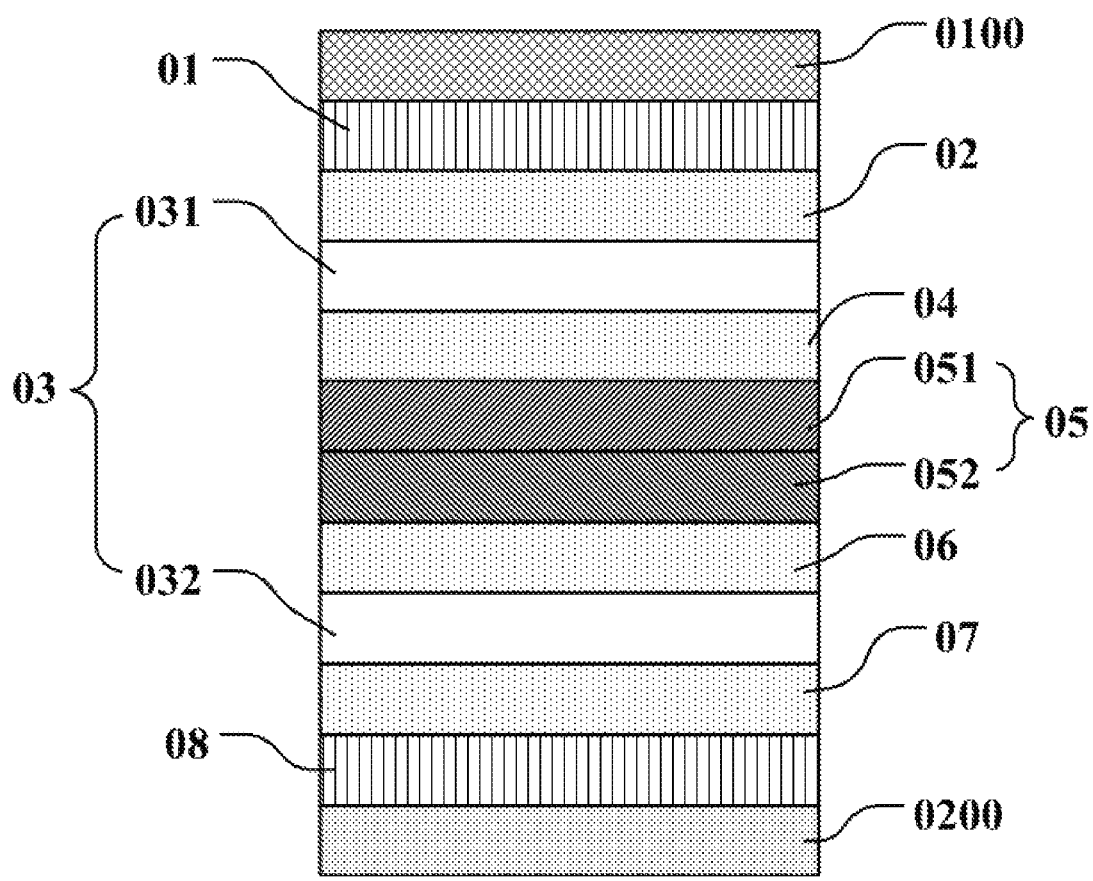
FIG. 1 is a structural schematic diagram of an organic light-emitting diode according to an embodiment in the prior art.
Figure 2:
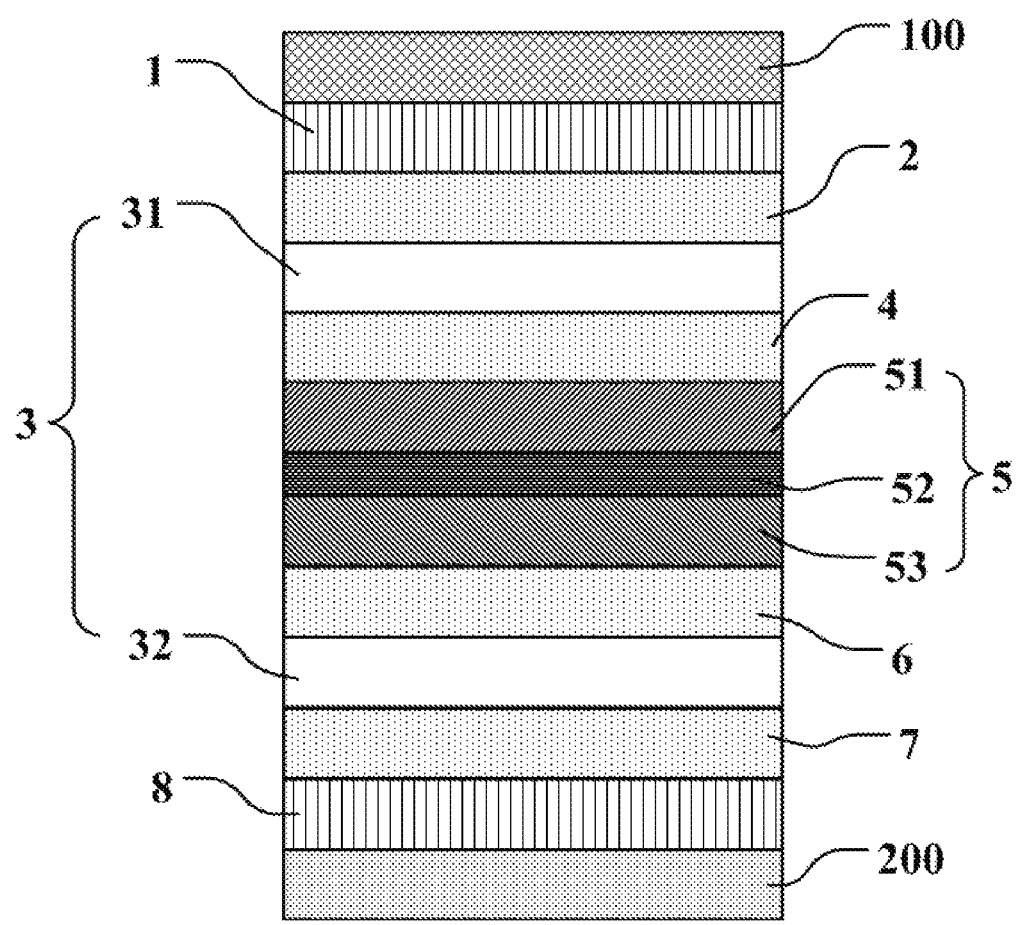
FIG. 2 is a structural schematic diagram of an organic light-emitting diode according to an embodiment of the present disclosure.

As shown in FIG. 2 which is a structural schematic diagram of the organic light-emitting diode according to an embodiment of the present disclosure, the organic light-emitting diode according to the embodiment of the present disclosure includes an anode 200, a cathode 100, at least two emitting layers 3 arranged between the anode 200 and the cathode 100, and a charge generation layer 5 arranged between every two adjacent emitting layers 3.

The charge generation layer 5 includes a first doping layer 51, an intermediate layer 52 and a second doping layer 53 which are arranged in sequence along the direction far away from the cathode 100, where the first doping layer 51 includes a P-type semiconductor material, and the second doping layer 53 includes a N-type semiconductor material.

The P-type semiconductor material includes a P-type inorganic semiconductor material, a P-type metal dopant or a P-type organic semiconductor material. The N-type semiconductor material includes a N-type inorganic semiconductor material, a N-type metal dopant or a N-type organic semiconductor material.

When the P-type semiconductor material includes the P-type inorganic semiconductor material or the P-type metal dopant, the fermi level of the material of the intermediate layer is greater than the fermi level of the P-type semiconductor material.

When the P-type semiconductor material includes the P-type organic semiconductor material, the fermi level of the material of the intermediate material is greater than the HOMO level (energy level of the highest occupied molecular orbital of the P-type organic semiconductor material.

When the N-type semiconductor material includes the N-type inorganic semiconductor material or the N-type metal dopant, the fermi level of the material of the intermediate layer is less than the fermi level of the N-type semiconductor material.

When the N-type semiconductor material includes the N-type organic semiconductor material, the fermi level of the material of the intermediate material is less than the LUMO level (energy level of the lowest unoccupied molecular orbital) of the N-type organic semiconductor material.

The luminous principle of the organic light-emitting diode is as follows: under the drive of an externally-applied electric field, the organic emitting layer leads to light emitting through the injection and recombination of charge carriers of the anode and the cathode, and the above charge carriers include electrons and holes. In one embodiment, under the effect of the drive voltage, the electrons and holes served as charge carriers are respectively injected into the electron injection layer and the hole injection layer from the cathode and the anode, the electrons and holes migrate to the organic emitting layer after penetrating through the electron transport layer and the hole transport layer, and the electrons and holes encounter in the organic emitting layer for recombination to form excitons, and the excitons exit from activation to release energy; and the released energy excites the luminescent molecules in the organic emitting layer, and the excited luminescent molecules emit a visible light after radiative relaxation.

In the organic light-emitting diode in the embodiment of the present disclosure, the charge generation layer 5 includes a first doping layer 51, an intermediate layer 52 and a second doping layer 53, and the charge generation layer 5 constitutes a P-I-N semiconductor structure. In the organic light-emitting diode, besides the cathode 100 and the anode 200 which can generate electrons and holes, the charge generation layer 5 can also generate holes and electrons which are respectively injected into the emitting layers 3 on the two sides of the charge generation layer 5, then the quantity of excitons which are formed by the recombination of the electrons and the holes of the emitting layers 3 can be increased, and further the luminous efficiency of the organic light-emitting diode can be improved.

In the organic light-emitting diode of the embodiment of the present disclosure, a charge generation layer 5 is arranged between two adjacent emitting layers 3, and under the effect of an externally-applied inverse voltage, the electrons of the P-type semiconductor migrate to the N-type semiconductor, then more holes migrate to the adjacent emitting layer 3; and the electrons of the N-type semiconductor migrate to the adjacent emitting layer 3. The electrodes of the electron-hole pairs generated by the charge generation layer 5 are divided into holes and electrons, then the holes and electrons are injected into the emitting layers 3 on the two sides through a channel due to zener breakdown, and are respectively recombined with the electrons and holes in the emitting layers on the two sides to form excitons, then the emitting layers 3 are enabled to emit light.

Figure 3:
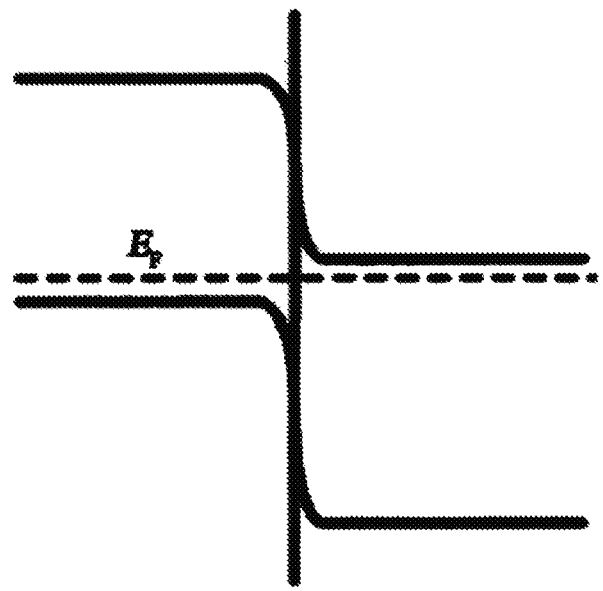
FIG. 3 is an energy band diagram of the PN junction in a balanced state.
Figure 4:
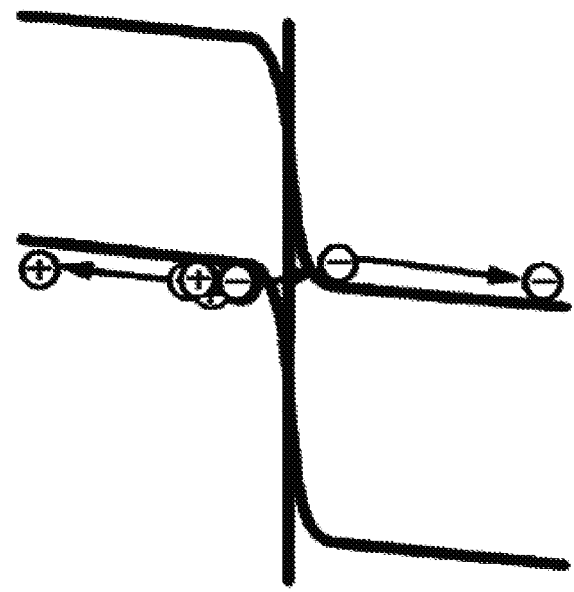
FIG. 4 is an energy band diagram of the PN junction after an inverse voltage is applied.

Zener breakdown refers to a phenomenon that when an inverse voltage is applied to a PN junction to generate a stronger electric field, the electric field is so strong that valence electrons can be directly pulled out from the covalent bonds, thus a large number of free electrons and holes are generated, and then the inverse current increases greatly. Please refer to FIG. 3 and FIG. 4. FIG. 3 is an energy band diagram of the PN junction in a balanced state, while FIG. 4 is an energy band diagram of the PN junction after an inverse voltage is applied. When an inverse voltage is applied to the PN junction, the energy band in the barrier region inclines, the greater the inverse voltage is, the higher the potential barrier is, then the stronger the built-in electric field in the barrier region is, and the more inclined the energy band in the barrier region is, and even the bottom conduction band of the N region can be lower than the top of valence band of the P region. When the inverse voltage reaches a preset value, the electrons in the P-region valence band may penetrate through a forbidden band via the tunnel effect to reach the N-region conduction band.

In the embodiment of the present disclosure, the charge generation layer 5 includes a first doping layer 51, an intermediate layer 52 and a second doping layer 53 which are arranged in sequence along the direction far away from the cathode 100, where the first doping layer 51 includes a P-type semiconductor material, and the second doping layer 53 includes a N-type semiconductor material. An intermediate layer 52 is arranged between the first doping layer 51 and the second doping layer 53, so as to prevent the P-type semiconductor material in the first doping layer 51 and the N-type semiconductor material in the second doping layer 53 from being diffused mutually after long-term operation, and further prevent the drive voltage of the organic light-emitting diode from being gradually increased. By adopting the solution, the drive voltage of the organic light-emitting diode can be lowered, the voltage of the organic light-emitting diode during long-term operation can be maintained to be stable, the luminous efficiency of the organic light-emitting diode can be improved, and the service life can be prolonged.

In one embodiment, the P-type semiconductor material can be P-type inorganic semiconductor material, P-type metal dopant or P-type organic semiconductor material, and the N-type semiconductor material can be N-type inorganic semiconductor material. N-type metal dopant or N-type organic semiconductor material. In actual application, the selection of the dopant of the first doping layer and the second doping layer is not limited, the P-type semiconductor material and the N-type semiconductor material can be the same type of material, and can also be different types of materials. For example, the selection of materials can be as follows: the P-type semiconductor material of the first doping layer can be P-type inorganic semiconductor material, and the N-type semiconductor material of the second doping layer can also be N-type inorganic semiconductor material; or the P-type semiconductor material of the first doping layer can be P-type metal dopant, while the N-type semiconductor material of the second doping layer can be N-type organic semiconductor material.

Figure 5:
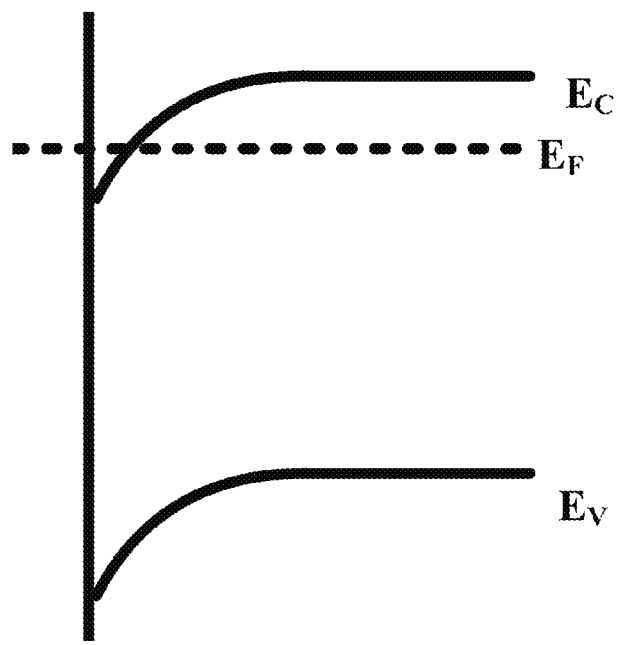
FIG. 5 is an energy band diagram of the N-type semiconductor when the fermi level of the material of the intermediate layer is less than the fermi level of the N-type semiconductor material.
Figure 6:
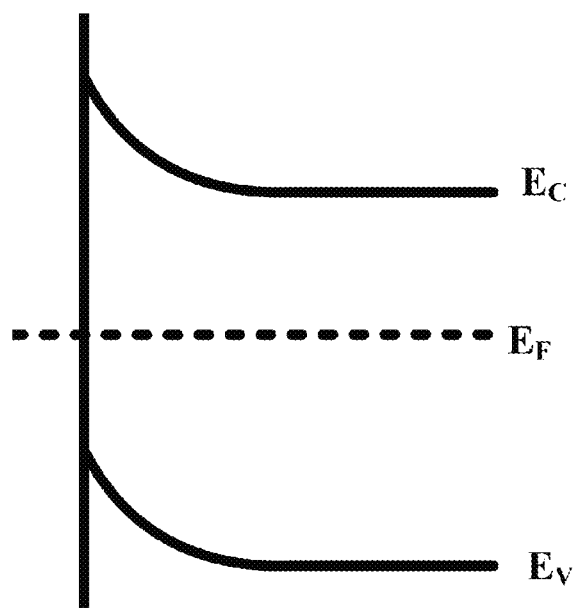
FIG. 6 is an energy band diagram of the N-type semiconductor when the fermi level of the material of the intermediate layer is greater than the fermi level of the N-type semiconductor material.

When the N-type semiconductor material includes the N-type inorganic semiconductor material or the N-type metal dopant, the fermi level of the material of the intermediate layer is less than the fermi level of the N-type semiconductor material. Such a structure may be used for the electrons to flow to the N-type semiconductor layer from the intermediate layer, and a negative space charge layer is formed on the surface of the N-type semiconductor layer. Please refer to FIG. 5 which is an energy band diagram showing that the fermi level of the material of the intermediate layer is less than the fermi level of the N-type semiconductor material. The energy band nearby the surface in the space charge region bends downwards, the electron concentration on the surface of the N-type semiconductor is greater than the equilibrium concentration inside the N-type semiconductor, and the electrons can migrate to the N-type semiconductor material with potentially no need of crossing a potential barrier, then an anti-barrier layer can be formed. In contrary, please refer to FIG. 6 which is an energy band diagram showing that the fermi level of the material of the intermediate layer is greater than the fermi level of the N-type semiconductor material. The energy band nearby the surface in the potential barrier region bends upwards, the electron concentration on the surface of the N-type semiconductor is less than the equilibrium concentration inside the N-type semiconductor, and the electrons can only migrate to the N-type semiconductor material after crossing a potential barrier, then a barrier layer can be formed. Therefore, the structure in the embodiment of the present disclosure may be used for the charge generation layer to generate electrons and also may be used for electron injection and transport.

When the N-type semiconductor material includes the N-type organic semiconductor material, the fermi level of the material in the intermediate layer is less than the LUMO level of the N-type organic semiconductor material. The reasons for adopting such a structure are the same as the above reasons, and will not be repeatedly described herein.

Figure 7:
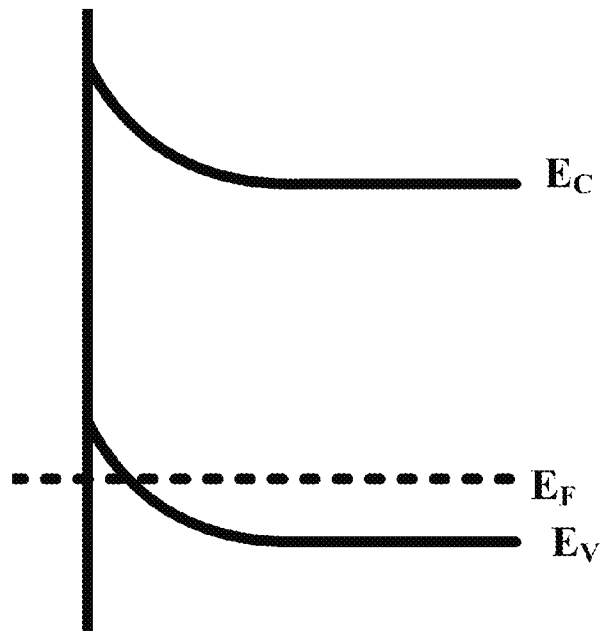
FIG. 7 is an energy band diagram of the P-type semiconductor when the fermi level of the material of the intermediate layer is greater than the fermi level of the P-type semiconductor material.
Figure 8:
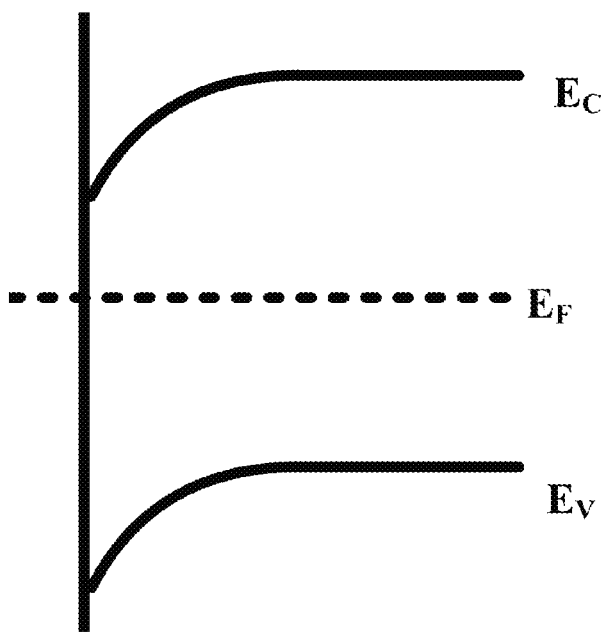
FIG. 8 is an energy band diagram of the P-type semiconductor when the fermi level of the material of the intermediate layer is less than the fermi level of the P-type semiconductor material.

Similarly, when the P-type semiconductor material includes the P-type inorganic semiconductor material or the P-type metal dopant, the fermi level of the material of the intermediate layer is greater than the fermi level of the P-type semiconductor material. Please refer to FIG. 7 which is an energy band diagram of the P-type semiconductor when the fermi level of the material of the intermediate layer is greater than the fermi level of the P-type semiconductor material. The electrons can migrate to the intermediate layer from the P-type semiconductor material with potentially no need of crossing a potential barrier, then more holes are generated, and an anti-barrier layer is formed. In contrary, please refer to FIG. 8 which is an energy band diagram of the P-type semiconductor when the fermi level of the material of the intermediate layer is less than the fermi level of the P-type semiconductor material. The electrons can only migrate to the intermediate layer from the P-type semiconductor material after crossing a potential barrier, then holes are difficult to form, and a barrier layer is formed. Therefore, the structure in the embodiment of the present disclosure may be used for the charge generation layer to generate holes and also may be used for hole injection and transport.

When the P-type semiconductor material includes the P-type organic semiconductor material, the fermi level of the material of the intermediate material is greater than the HOMO level of the P-type organic semiconductor material. The reasons for adopting such a structure are the same as the above reasons, and will not be repeatedly described herein.

In an embodiment, the material of the intermediate layer is not specifically limited, and can be metal, metal alloy or metal oxide. The material of the intermediate layer includes silver element, ytterbium element, europium element or zinc element. In one embodiment, when the P-type semiconductor material includes the P-type inorganic semiconductor material or the P-type metal dopant, the fermi level of the P-type semiconductor material ranges from 1.8 eV to 5.5 eV. For example, the fermi level of the P-type semiconductor material can be 2 eV, 2.2 eV, 2.5 eV, 3 eV, 3.4 eV, 3.8 eV, 4 eV, 4.3 eV, 4.8 eV, 5 eV, 5.2 eV or 5.4 eV, etc.

When the P-type semiconductor material includes the P-type organic semiconductor material, the HOMO level of the P-type organic semiconductor material ranges from −6.5 eV to −5 eV. For example, the HOMO level of the P-type organic semiconductor material can be −5.2 eV, −5.5 eV, −5.8 eV, −6 eV, −6.1 eV or −6.4 eV, etc.

When the N-type semiconductor material includes the N-type inorganic semiconductor material or the N-type metal dopant, the fermi level of the N-type semiconductor material ranges from 1.8 eV to 5.5 eV. For example, the fermi level of the N-type semiconductor material can be 2 eV, 2.2 eV, 2.5 eV, 2.7 eV, 3 eV, 3.2 eV, 3.5 eV, 3.8 eV, 4 eV, 4.2 eV, 4.5 eV, 4.8 eV, 5 eV or 5.2 eV, etc.

When the N-type semiconductor material includes N-type organic semiconductor material, the LUMO level of the N-type organic semiconductor material ranges from −3.5 eV to −1.8 eV. For example, the LUMO level of the N-type organic semiconductor material can be −2 eV, −2.2 eV, −2.5 eV, −2.7 eV, −3 eV, −3.1 eV or −3.4 eV, etc.

In an embodiment, the thickness of the intermediate layer ranges from 0.5 nm to 10 nm. The first doping layer and the second doping layer can be isolated when the thickness of the intermediate layer is greater than 0.5 nm, and when the thickness of the intermediate layer is less than 10 nm, the first doping layer, the intermediate layer and the second doping layer can form a PIN structure, such that the organic light-emitting diode emits light normally. For example, the thickness of the intermediate layer can be 0.8 nm, 1 nm, 1.5 nm, 2 nm, 2.7 nm, 3 nm, 3.4 nm, 3.8 nm, 4 nm, 4.3 nm, 4.5 nm, 4.9 nm, 5 nm, 5.5 nm, 5.9 nm, 6 nm, 6.5 nm, 7 nm, 7.1 nm, 7.5 nm, 8 nm, 8.4 nm, 8.6 nm, 9 nm, 9.3 nm or 9.7 nm, etc.

In an embodiment, the volume concentration of the P-type semiconductor material doped in the first doping layer ranges from 3% to 35%. When the volume concentration of the P-type semiconductor material is within the above range, it may be used for separating the electrons from the holes in the charge generation layer and improving the luminous efficiency of the organic light-emitting diode. For example, the volume concentration of the P-type semiconductor material is 3.5%, 4%, 6%, 7%, 7.8%, 8%, 9.5%, 10%, 10.6%, 11%, 11.5%, 12%, 14%, 15%, 16%, 18%, 19%, 20%, 22%, 24%, 25%, 26%, 26.5%, 27%, 27.5%, 28%, 28.4%, 29%, 30%, 30.5%, 31%, 32%, 33% or 33.8%, etc.

In an embodiment, the volume concentration of the N-type semiconductor material doped in the second doping layer ranges from 3% to 45%. When the volume concentration of the N-type semiconductor material is within the above range, it may be used for separating the electrons from the holes in the charge generation layer and improving the luminous efficiency of the organic light-emitting diode. For example, the volume concentration of the N-type semiconductor material is 3.5%, 4%, 5%, 7%, 7.5%, 8%, 9%, 10.5%, 10.6%, 11.5%, 12%, 13%, 15%, 17%, 19%, 20%, 22%, 23%, 25%, 26%, 26.8%, 27%, 27.5%, 28%, 29%, 29.5%, 30%, 32%, 33.8%, 35%, 38%, 39.8%, 40%, 42%, 43% or 44%, etc.

In one embodiment, material of the emitting layer is not limited. For example, the emitting layer can be a fluorescent emitting layer and can also be a phosphorescent emitting layer. The materials of at least two emitting layers in the organic light-emitting diode can be identical and can also be not identical. For example, the organic light-emitting diode includes two emitting layers, the two emitting layers can be respectively a fluorescent emitting layer and a phosphorescent emitting layer, and the two emitting layers can also be both fluorescent emitting layers or be both phosphorescent emitting layers.

In an embodiment of the present disclosure, the number of the emitting layers can be two and can also be three. Please refer to FIG. 2, according to an embodiment of the present disclosure, the number of the emitting layers 3 of the organic light-emitting diode is two, and the emitting layer 3 includes a cathode 100, an electron injection layer 1, a first electron transport layer 2, a first emitting layer 31, a first hole transport layer 4, a charge generation layer 5, a second electron transport layer 6, a second emitting layer 32, a second hole injection layer 7, a hole injection layer 8 and an anode 200 which are arranged in sequence in an overlaying manner, where the charge generation layer 5 includes a first doping layer 51, an intermediate layer 52 and a second doping layer 53 which are arranged in sequence along the direction far away from the cathode 100. In one embodiment, the two emitting layers 3 can be respectively a blue emitting layer and a yellow emitting layer.

Figure 9:
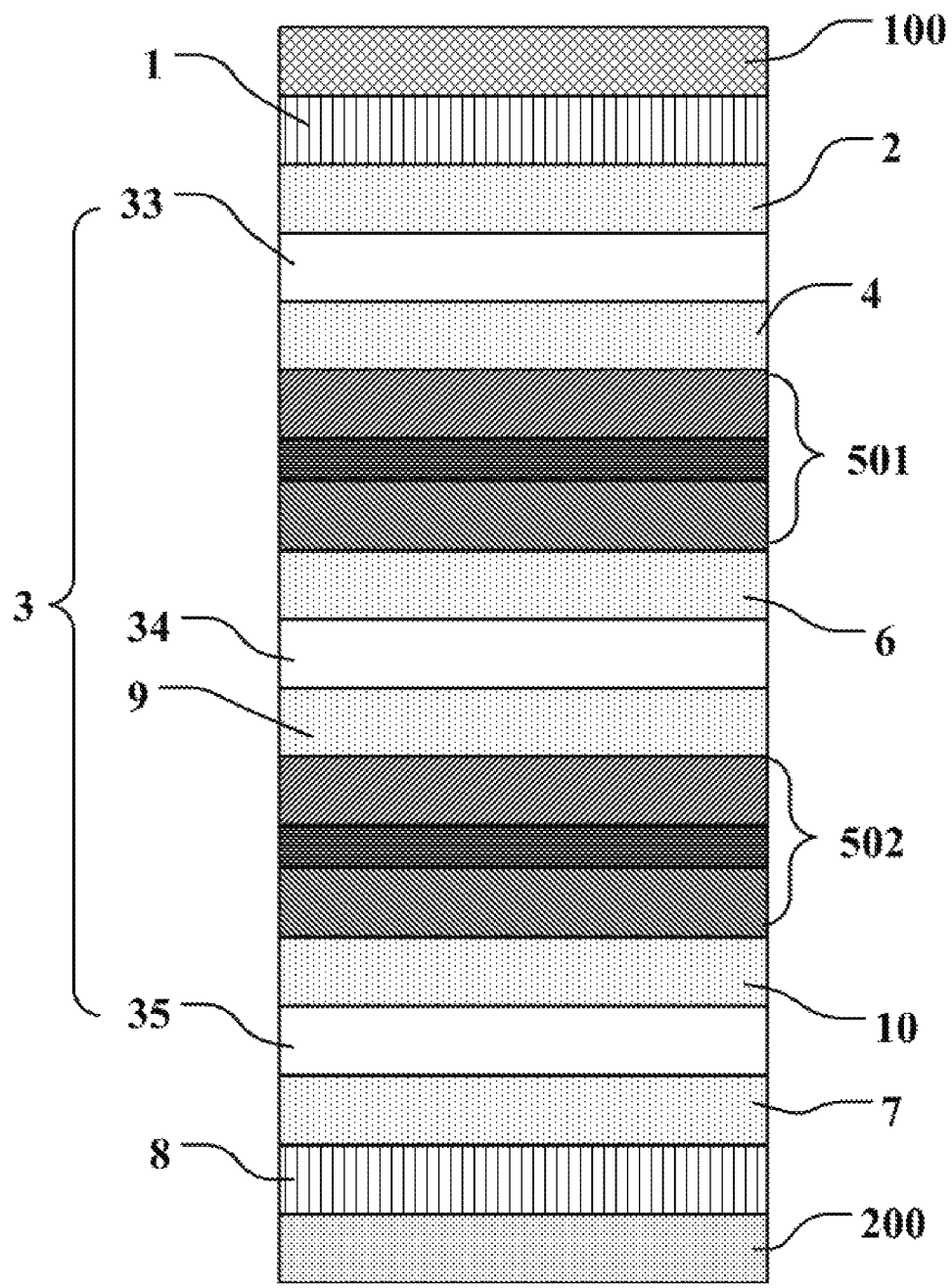
FIG. 9 is a structural schematic diagram of an organic light-emitting diode according to another embodiment of the present disclosure.

Please refer to FIG. 9 which is a structural schematic diagram of an organic light-emitting diode according to another embodiment of the present disclosure. The organic light-emitting diode in the present embodiment includes three emitting layers 3. In one embodiment, the organic light-emitting diode includes a cathode 100, an electron injection layer 1, a first electron transport 2, a third emitting layer 33, a first hole transport layer 4, a first charge generation layer 501, a second electron transport layer 6, a fourth emitting layer 34, a second hole transport layer 9, a second charge generation layer 502, a third electron transport layer 10, a fifth emitting layer 35, a second hole transport layer 7, a hole injection layer 8 and an anode 200 which are arranged in sequence in an overlaying manner, where the charge generation layer according to any of the above technical solution is arranged between every two adjacent emitting layers 3.

In one embodiment, when the organic light-emitting diode includes three emitting layers, the three emitting layers usually include a red emitting layer, a green emitting layer and a blue emitting layer.

The embodiment of the present disclosure further provides a display panel, and the display panel includes the organic light-emitting diode according to any of the above technical solution.

The display panel can still maintain a stable drive voltage after long-term use, and the use power consumption of the display panel is lower, the service life is prolonged, and the luminous efficiency is higher.

Figure 10:
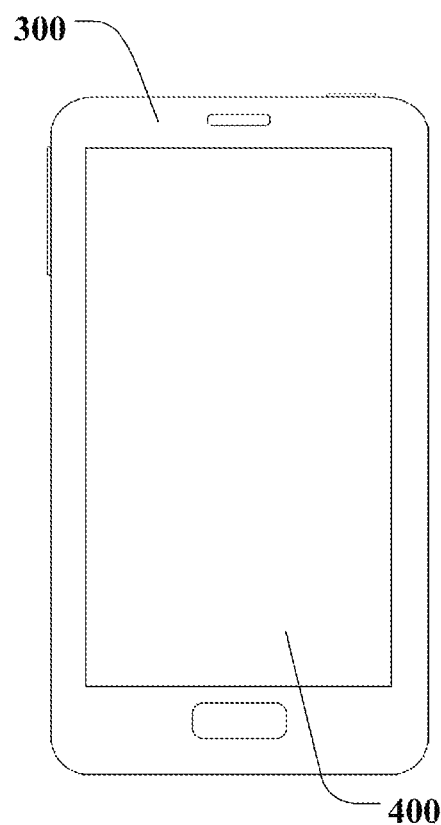
FIG. 10 is a structural schematic diagram of a display device according to an embodiment of the present disclosure.

Please refer to FIG. 10. The embodiment of the present disclosure further provides a display device 300, and the display device 300 includes the above display panel 400.

In the embodiment of the present disclosure, the display device is not limited in specific types, and can be a mobile phone, a display, a tablet computer or a television. For example, the display device shown in FIG. 10 is a mobile phone.

In the present disclosure, the inventor selected two groups of organic light-emitting diodes for comparative experiment, which are respectively an experiment group and a control group, where the organic light-emitting diode in the embodiment of the present disclosure is in the experiment group, namely, the charge generation layer includes a first doping layer, an intermediate layer and a second doping layer; the existing organic light-emitting diode is in the control group, except that the charge generation layer does not include an intermediate layer, the other structures of the organic light-emitting diode in the control group are the same as those of the organic light-emitting diode in the experiment group. In one embodiment, the inventor enables the above two groups of organic light-emitting diodes to be in an operating state for a long time, and detects the change of the drive voltage of each organic light-emitting diode. The experimental results are as shown in FIG. 11 which shows the change of the drive voltage of each organic light-emitting diode during the fifteen-day operation.

Figure 11:
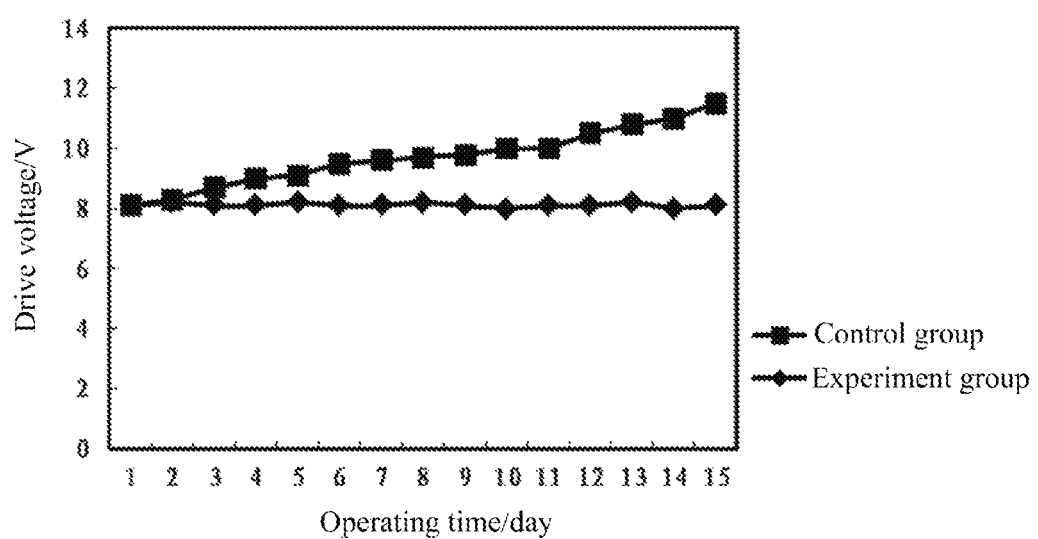
FIG. 11 is a diagram showing the change of the drive voltage of the organic light-emitting diode along with the extension of the operating time.

It can be seen from FIG. 11 that, the drive voltage of the organic light-emitting diode in the embodiment of the present disclosure is in a stable state for a long time, and is nearly unchanged, while the drive voltage of the organic light-emitting diode in the control group is gradually increased with the extension of the operation time. Therefore, the solution can improve the voltage stability of the organic light-emitting diode during long-term operation, reduce the use power consumption, prolong the service life and improve the luminous efficiency of the organic light-emitting diode.

The invention claimed is:

1. An organic light-emitting diode, comprising:
an anode, a cathode, at least two emitting layers arranged between the anode and the cathode, and a charge generation layer arranged between every two adjacent emitting layers, wherein:
the charge generation layer comprises a first doping layer, an intermediate layer and a second doping layer which are arranged in sequence along the direction far away from the cathode, wherein the first doping layer comprises a P-type semiconductor material, and the second doping layer comprises a N-type semiconductor material;
the P-type semiconductor material comprises a P-type inorganic semiconductor material or a P-type metal dopant, and a fermi level of a material of the intermediate layer is greater than a fermi level of the P-type semiconductor material;
the N-type semiconductor material comprises a N-type inorganic semiconductor material, and the fermi level of the material of the intermediate layer is less than a fermi level of the N-type semiconductor material;
the material of the intermediate layer includes ytterbium element, and a thickness of the intermediate layer ranges from 0.5 nm to 1.5 nm;
the fermi level of the P-type semiconductor material ranges from 1.8 eV to 3.4 eV; and
the fermi level of the N-type semiconductor material ranges from 3.5 eV to 5.5 eV.

2. The organic light-emitting diode according to claim 1, wherein a volume concentration of the P-type semiconductor material doped in the first doping layer ranges from 3% to 35%.

3. The organic light-emitting diode according to claim 1, wherein a volume concentration of the N-type semiconductor material doped in the second doping layer ranges from 3% to 45%.

4. The organic light-emitting diode according to claim 1, wherein the emitting layer comprises a fluorescent emitting layer or a phosphorescent emitting layer.

5. The organic light-emitting diode according to claim 1, wherein the number of the emitting layers is two or three.

6. A display panel, comprising an organic light-emitting diode, the organic light-emitting diode comprising an anode, a cathode, at least two emitting layers arranged between the anode and the cathode, and a charge generation layer arranged between every two adjacent emitting layers, wherein:
the charge generation layer comprises a first doping layer, an intermediate layer and a second doping layer which are arranged in sequence along the direction far away from the cathode, wherein the first doping layer comprises a P-type semiconductor material, and the second doping layer comprises a N-type semiconductor material;
the P-type semiconductor material comprises a P-type inorganic semiconductor material or a P-type metal dopant, and a fermi level of a material of the intermediate layer is greater than a fermi level of the P-type semiconductor material;
the N-type semiconductor material comprises a N-type inorganic semiconductor material, and the fermi level of the material of the intermediate layer is less than a fermi level of the N-type semiconductor material;
the material of the intermediate layer includes ytterbium element, and a thickness of the intermediate layer ranges from 0.5 nm to 1.5 nm;
the fermi level of the P-type semiconductor material ranges from 1.8 eV to 3.4 eV; and
the fermi level of the N-type semiconductor material ranges from 3.5 eV to 5.5 eV.

7. The display panel according to claim 6, wherein a volume concentration of the P-type semiconductor material doped in the first doping layer ranges from 3% to 35%.

8. The display panel according to claim 6, wherein a volume concentration of the N-type semiconductor material doped in the second doping layer ranges from 3% to 45%.

9. The display panel according to claim 6, wherein the emitting layer one or more of: a fluorescent emitting layer, and a phosphorescent emitting layer.

10. The display panel according to claim 6, wherein the number of the emitting layers is two or three.

11. A display device, comprising:
a display panel, the display panel comprising an organic light-emitting diode, the organic light-emitting diode comprising an anode, a cathode, at least two emitting layers arranged between the anode and the cathode, and a charge generation layer arranged between every two adjacent emitting layers, wherein:
the charge generation layer comprises a first doping layer, an intermediate layer and a second doping layer which are arranged in sequence along the direction far away from the cathode, wherein the first doping layer comprises a P-type semiconductor material, and the second doping layer comprises a N-type semiconductor material;
the P-type semiconductor material comprises a P-type inorganic semiconductor material or a P-type metal dopant, and a fermi level of a material of the intermediate layer is greater than a fermi level of the P-type semiconductor material;
the N-type semiconductor material comprises a N-type inorganic semiconductor material, and the fermi level of the material of the intermediate layer is less than a fermi level of the N-type semiconductor material;
the material of the intermediate layer includes ytterbium element, and a thickness of the intermediate layer ranges from 0.5 nm to 1.5 nm;
the fermi level of the P-type semiconductor material ranges from 1.8 eV to 3.4 eV; and
the fermi level of the N-type semiconductor material ranges from 3.5 eV to 5.5 eV.

* * * * *